US 6,740,159 B2

(12) United States Patent
Kandler et al.

(10) Patent No.: US 6,740,159 B2
(45) Date of Patent: May 25, 2004

(54) METHOD OF MAKING A FRACTURE-RESISTANT CALCIUM FLUORIDE SINGLE CRYSTAL AND ITS USE

(75) Inventors: Joerg Kandler, Jena (DE); Ewald Moersen, Mainz (DE); Burkhard Speit, Jena (DE); Harry Bauer, Aalen-Ebnat (DE); Thure Boehm, Aalen (DE); Eric Eva, Aalen (DE); Michael Thier, Moegglingen (DE); Hexin Wang, Koenigsbronn (DE); Frank Richter, Lenzburg (CH); Hans-Josef Paus, Stuttgart (DE)

(73) Assignees: Schott Glas, Mainz (DE); Carl Zeiss SMT AG, Oberkochen (DE)

( * ) Notice: Subject to any disclaimer, the term of this patent is extended or adjusted under 35 U.S.C. 154(b) by 21 days.

(21) Appl. No.: 10/230,232

(22) Filed: Aug. 28, 2002

(65) Prior Publication Data

US 2003/0101923 A1 Jun. 5, 2003

(30) Foreign Application Priority Data

Aug. 31, 2001 (DE) .......................... 101 42 649

(51) Int. Cl.⁷ ............................. C30B 158/04
(52) U.S. Cl. .............. 117/19; 117/1; 117/2; 117/13
(58) Field of Search .............................. 117/1, 2, 13, 19

(56) References Cited

U.S. PATENT DOCUMENTS

| 4,086,555 A | 4/1978 | Krikorian et al. |
| 2001/0001383 A1 | 5/2001 | Ohba et al. |
| 2001/0008540 A1 | 7/2001 | Oba et al. |

FOREIGN PATENT DOCUMENTS

| EP | 0 939 147 A2 | 9/1999 |
| EP | 1 154 046 A1 | 11/2001 |
| JP | 09315815 A | 12/1997 |
| JP | 10-59799 | 3/1998 |
| WO | 01/64977 A1 | 9/2001 |

*Primary Examiner*—Felisa Hiteshew
(74) *Attorney, Agent, or Firm*—Michael J. Striker

(57) ABSTRACT

A method of making a fracture-resistant large-size calcium fluoride single crystal is described, which is suitable for an optical component for radiation in the far UV range. The calcium fluoride raw material for the single crystal is first melted and subsequently solidified by cooling the melt to form a single crystal. However the calcium fluoride raw material is doped with from 1 to 250, preferably 1 to 100, ppm of strontium, preferably added as strontium fluoride, and contains from 1 to 10 ppm of sodium as well as up to 100 ppm of other impurities.

14 Claims, No Drawings

METHOD OF MAKING A FRACTURE-RESISTANT CALCIUM FLUORIDE SINGLE CRYSTAL AND ITS USE

BACKGROUND OF THE INVENTION

1. Field of the Invention

The present invention relates to a method of making breakage-proof or fracture-resistant calcium fluoride single crystals and their use.

2. Description of the Related Art

Single crystals made of calcium fluoride are required as a starting material for optical components used in DUV photolithography because of their ultraviolet radiation transmission properties, among other things. In DUV photolithography radiation sources, such as excimer lasers, which produce radiation with wavelengths less than 250 nm in the deep or far ultraviolet (DUV=deep or far UV), produce fine structure on a semiconductor wafer coated with a photolacquer. In addition, optical components made from the calcium fluoride, such as lenses or prisms, must have a great optical homogeneity. Defects or faults in the calcium fluoride crystals interfere or destroy the optical homogeneity. The calcium fluoride then exhibits stress birefringence. Calcium fluoride crystals with defects, especially those with stress birefringence, are of course unsuitable for optical components made from them. These crystal defects usually comprise foreign atoms, i.e. impurities, which are incorporated into the crystal lattice and thus interfere or perturb the uniformity of the optical properties of the crystal. Therefore single crystals for optical elements should be made from material having the highest possible purity.

Thus JP-A-10-059799 describes, for example, the action of strontium in calcium fluoride crystals. Accordingly the calcium fluoride should not contain more than $1 \times 10^{18}$ atoms/cm$^3$ of strontium, so that the optical properties of the calcium fluoride are not impaired. On the other hand, JP-A-09-315815 teaches that the transmission of intense laser light in the UV range by a calcium fluoride crystal is considerably reduced if the calcium fluoride crystal contains from 1 to 600 ppm of strontium and from 1 to 10 ppm of lanthanum and yttrium impurities. This is the case with the above-described usage of these crystals.

Very high purity calcium fluoride single crystals with dimensions in the decimeter range are made according to conventional crystal growth methods, such as the Stockbarger-Bridgman Methods or the VGF (vertical gradient freezing, cooling with a vertical temperature gradient) methods. These large starting crystals are then put in a form required for optical components by cleaving, grinding or the like and the finished optical components are made finally by special treatments, such as surface processing or shaping.

It has now been shown that the fracture or breakage frequency of crystals, especially high purity calcium fluoride crystals, is comparatively high during processing. Not only is the destruction of a nearly finished component in a final processing step a nuisance, but also micro-fractures and dislocations of the crystal lattice arise during processing, which can finally lead to an optical component having reduced optical transmittance.

The fracture energy of the calcium fluoride crystal along the <111> surface is only 490 mJ/m$^2$, which is very low. Shale or schist has similar low values. For comparison, for example, quartz has a fracture energy of 4300 mJ/m$^2$.

In order to make optical components, such as lenses, the raw crystalline material is cut, ground and polished. These steps amount to mechanically working on the crystal structure. The optic axis of the lens extends along the surface normal to the <111> plane in calcium fluoride. Strong shear forces are produced during working of a curved lens surface, which act along the <111> plane. For that reason the crystal undergoes microscopic as well as macroscopic damage, in the form of fractures and dislocations.

There have been attempts to make lenses with the optic axis extending with an orientation that is somewhat displaced from the normal to the <111> plane. However when the optic axis deviates from the normal to the <111> plane the hardening anisotropies appear more pronounced during working, which only increases the problems encountered during working. Additional problems with stress birefringence results when the deviations are even larger.

SUMMARY OF THE INVENTION

It is an object of the present invention to provide a method of making a calcium fluoride single crystal of the above-described type with a higher fracture resistance or breakage resistance.

This object and others, which will be made more apparent hereinafter, are attained in a method for making fracture-resistant large-size calcium fluoride single crystals for optical components, wherein said method comprises melting calcium fluoride raw material and subsequently cooling the resulting calcium fluoride melt to form the single crystal by solidification.

According to the invention the calcium fluoride raw material must be doped with or contain between 1 and 250 ppm of strontium.

According to the invention when the calcium fluoride raw material is weakly doped with from 1 to 250 ppm of strontium, preferably 10 to 100 ppm of strontium, the breakage or fracture resistance of the single crystal made from the crystalline raw material is increased by from 10 to 15 percent. Accordingly fewer dislocations and micro-fractures occur when the single crystal is worked or further processed. The strontium is added in the form of its salts, especially halides or also oxides. A fluoride salt is an especially preferred form for the strontium-containing additive or dopant.

It is best when the strontium is added to the calcium fluoride raw material in an amount of from 80 to 140 ppm, usually about 100 ppm. The fracture energy is generally increased to 560 mJ/m$^2$ when these small amounts of strontium, namely 100 ppm, are added. Because of this increase in the fracture energy the losses due to breakage of the crystal during processing are considerably reduced, whereby the overall yield is greatly increased.

An additional increase in fracture energy of, e.g., only about 10 mJ/m$^2$ to 570 mJ/m$^2$ results when the amount of strontium added is increased to 200 ppm.

It has been shown that the optical properties of the calcium fluoride single crystals are negatively influenced by reduced addition of strontium.

One skilled in the art expects that addition of additional impurities, like the Sr compounds, into the calcium fluoride crystal will increase the number of the defects and imperfections in the crystal lattice. However surprisingly in spite of that a definite reduction of fracture occurrences in the crystals was observed when the strontium was added to the calcium fluoride crystal raw material according to the invention as described above. The optical properties of the crystals are stabilized as a result.

Foreign atoms, such as Na, K, Li, Mg and Ba, can be contained as impurities in the calcium fluoride raw material for the single crystals. Also other impurities are present but at levels substantially below 1 ppm. Also the former impurities may be forced to levels below 1 ppm by a special process during crystal growth, in which they are volatilized. This is certainly true for sodium. Sodium however is an element, which is present in human skin in comparatively large amounts. Because the single crystals are always unavoidably processed in the presence of humans, the sodium concentration cannot be reduced, e.g. on the surface, to less than 2 ppm.

Interestingly an addition of sodium or an increase of the sodium content in the calcium fluoride crystal doped with strontium as described above scarcely increases the fracture energy. On the other hand, the strontium compensates for the negative action of the sodium impurities.

The calcium fluoride raw material for making the single crystal can thus contain between about 1 and 10 ppm of sodium as an impurity.

The increase of the mechanical strength of the calcium fluoride crystal by addition of an extremely small amount of less than 250 ppm, preferably less than 200 ppm, usually about 100 ppm, of strontium is very surprising in view of the at least 2 to 3 percent additive amounts of dopants normally required to cause such effects in crystals. An additional important fact, which favors the use of strontium, is that the strontium does not locally collect or is not enriched in the crystal, but is uniformly distributed throughout the crystalline material. The uniform distribution of the strontium is an indispensible requirement for mechanical strength according to the invention.

The invention is further described further with the aid of the following preferred embodiment.

DESCRIPTION OF THE PREFERRED EMBODIMENTS

A large-size single crystal made of $CaF_2$ with a diameter of 25 cm is prepared in a pipe-shaped or tube-shaped vessel that is closed with a cover. The $CaF_2$-crystalline raw material is placed in the vessel and is subjected to a rotationally symmetric temperature profile that moves relative to the vessel in a direction to the vessel bottom vessel bottom from the vessel opening, so that the calcium fluoride raw material is first melted, next fused and then subsequently solidified in the lower temperature portion of the temperature profile to form the single crystal, as described, for example, in PCT/DE 01/00789. The single crystal is provided for making optical components for the DUV range ($\lambda$<250 nm; DUV means deep or far UV).

$CaF_2$-single crystals are made generally in a pipe-shaped or tube-shaped drawing furnace under vacuum at $10^{-4}$ to $10^{-7}$ mbar according to the Stockbarger-Bridgman or the Vertical Gradient Freezing Method (VGF). The vessel filled with the raw material for the crystal is acted on over its entire length with a temperature gradient in the vertical direction and in the horizontal (rotationally symmetric) direction, in order to first melt the material and then solidify it again with a small temperature gradient. The vertical gradient should substantially guarantee a planar crystallization front. Usually a seed crystal is located in the bottom of the vessel. There the temperature is lowest. The crystallization begins at the seed crystal, when the temperature of the calcium fluoride melt is lowered there below the melting point. According to Stockbarger-Bridgman the vessel is moved mechanically through a temperature profile provided in the drawing oven. According to the newer VGF method the temperature profile of a gradient pipe over is electrically moved (with a speed of about 1 mm/hour) past the resting vessel. The manufacturing time for a calcium fluoride single crystal having a height of from 200 to 400 mm and a diameter of about 250 mm for optical components amounts to several weeks.

A homogeneous single crystal with an index of refraction variation of $\Delta n < 1 \times 10^{-6}$ is only guaranteed by the most exacting control of the temperature at about 1400° C. in the vicinity of the crystallization front as well as a sufficient dwell time at these temperatures. The allowed temperature variation at the crystallization front is less than 1° C. axially and less than 5° C. in a radial direction. Crystal non-uniformities are characterized by stress birefringence, which makes the crystals unusable for optical components.

The components made from the calcium fluoride single crystals—generally the components are lenses, prisms and optical windows—are, for example, used in optical devices for DUV lithography, such as steppers and excimer lasers.

Steppers are devices, which optically structure integrated circuits on photolacquer coated semiconductor wafers. In order to be able to build the required fine structures (structure width amounts currently to 0.25 em), the optical components must have a high uniformity. The index of refraction must be constant, as previously mentioned, over the entire component at $\Delta n < 1 \times 10^{-6}$. Excimer lasers with wavelengths of 193 nm to 157 nm may be used as the radiation source.

In order to keep the irradiation time during irradiation of the photolacquer-coated semiconductor wafer small, higher intensity radiation and optical components having a higher transmittance are required. Shorter irradiation time means reduced time consumption during manufacture of the semiconductor chips. The plant making the chips then has a high throughput.

The transmittance of the calcium fluoride single crystals in the DUV range can be changed subsequently. When microscopic faults or imperfections are introduced into the crystal during processing, the transmission properties of the crystal are impaired.

Each fault or imperfection in the regular crystal structure, such as vacancies, dislocations and foreign atoms in the crystal lattice, increases the sensitivity to radiation damage due to hard radiation, such as intense UV light from excimer lasers. Light absorbing color centers arise in the crystal, which reduce its transmittance.

The total amount of foreign atoms, such as Na, K, Li, Mg and Ba, that are present in the calcium fluoride can be up to 100 ppm. The foreign atom content may be kept less than 1 ppm by special measures, such as purification of the starting material and/or use of scavengers during crystal growth.

The making of a $CaF_2$ single crystals occurs in six phases or stages:

1. The vessel with the calcium fluoride raw material is slowly heated to the desorption temperature of the water of about 400° C. to 600° C. and loaded for a time interval at these temperatures, in order to dewater the raw material.

2. Subsequently the temperature is increased to about 1450° C. during a time interval of about 20 hours; in this phase removal of oxygen from the raw material takes place. In addition, fluorides, such as $PbF_2$, $SnF_2$ or $ZnF_2$, which have a high affinity for oxygen and which react with the oxygen contained in this raw material to form corresponding volatile oxides, are mixed in the raw material. The added fluorides mixed with the raw material that are not consumed completely evaporate at these temperatures. The method is called the scavenger process.

3. Volatilization of the foreign atom compounds together with calcium fluoride occurs for about a week at 1450° C. The amount of the volatilized material that is released determines the extent to which the crystal is free of foreign atoms. A minimum mass of material to be volatilized in order to obtain the required single crystal purity for each crystal growth unit depends on the raw material used and the structure of the unit.

4. Subsequently the individual crystal growth method for a single crystal runs in an approximately two-week phase, during which the temperatures are generally at about 1200° C.

5. and 6. The crystal produced is then cooled in two stages or phases to room temperature.

In the methods described here the calcium fluoride raw material for the single crystal is doped with between 1 and 250 ppm of Sr, preferably between 10 and 200 ppm of Sr and most preferably about 100 ppm of Sr.

The raw material is preferably doped with the Sr by adding $SrF_2$ to it.

Also a comparatively high level of impurities in the $CaF_2$ single crystal in the form of high sodium content between about 1 and 10 ppm no longer has an influence on the properties of the crystal.

Optical components, for example lenses, are manufactured from crystalline raw material by cleavage, sawing, cutting, grinding, lapping and/or polishing as finishing steps. These finishing steps involve strong mechanical forces acting on the crystal structure of the calcium fluoride with its comparatively small fracture or breaking or surface energy of about 490 $mJ/m^2$. The calcium fluoride preferably cleaves along the <111> surfaces, which are also identical with the surfaces of the lens, so that mechanical force is acting parallel to the surfaces during processing. As a result the material easily fractures along the along a <111> surface and thus material failure occurs easily.

However the cleavage resistance or fracture resistance of the raw material has been increased by about 10 to 15 percent.

The increase in fracture resistance parallel to the <111> surfaces is determined as follows: The surfaces of a cube of the material with a 15 mm edge length are ground and polished. The upper and lower sides of the cube are <111> surfaces. The cube is fixed on a table to prevent movement and a piston or other pressing element is pressed against the upper half of the side surfaces until a fracture occurs.

The invention also includes to the use of a single crystal of the invention for making optical elements for DUV lithography and wafers coated with photolacquer. Thus it also relates to the manufacture of electronic devices.

The invention also includes using single crystals obtained by the methods according to the invention and/or in the apparatus according to the invention for making lenses, prisms, light conducting rods, optical windows and optical devices for DUV photolithography, especially for making steppers and excimer lasers and thus also for making integrated circuits as well as electronic units, such as computer chips contained in computers as well as other electronic units, which contained chip-like integrated circuits.

The disclosure in German Patent Application 101 42 649.6 of Aug. 31, 2001 is incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in a method of making a fracture-resistant calcium fluoride single crystal and its use, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:

1. An optical component made from a fracture-resistant large-size calcium fluoride single crystal, wherein said optical component is a lens, a prism, a light conducting rod or an optical window and said fracture-resistant large-size calcium fluoride single crystal is made by a method comprising doping a calcium fluoride raw material with from 1 to 250 ppm of strontium; melting said calcium fluoride raw material to form a calcium fluoride melt; and subsequently cooling the calcium fluoride melt to form the calcium fluoride single crystal by solidification of the melt.

2. An optical component made from a fracture-resistant large-size calcium fluoride single crystal, wherein said optical component is an optical element for DUV lithography, a stepper, an excimer laser, a wafer, a computer chip, a electronic chip or an integrated circuit for a computer or other electronic device, and said fracture-resistant large-size calcium fluoride single crystal is made by a method comprising doping a calcium fluoride raw material with from 1 to 250 ppm of strontium; melting said calcium fluoride raw material to form a calcium fluoride melt; and subsequently cooling the calcium fluoride melt to form the calcium fluoride single crystal by solidification of the melt.

3. A method of making a fracture-resistant large-size calcium fluoride single crystal, said method comprising the steps of:

a) doping a calcium fluoride raw material with from 1 to 250 ppm of strontium;

b) melting said calcium fluoride raw material to form a calcium fluoride melt; and subsequently c) cooling the calcium fluoride melt formed in step b) to form the calcium fluoride single crystal by solidification of the melt.

4. The method as defined in claim 3, wherein said calcium fluoride raw material is doped with from 10 to 200 ppm of said strontium.

5. The method as defined in claim 3, wherein said calcium fluoride raw material is doped with from 80 to 140 ppm of said strontium.

6. The method as defined in claim 3, wherein said calcium fluoride raw material is doped with said strontium by adding strontium fluoride to said calcium fluoride raw material.

7. The method as defined in claim 3, wherein said calcium fluoride raw material contains from 1 to 10 ppm of sodium as an impurity.

8. The method as defined in claim 3, wherein said calcium fluoride raw material contains up to 100 ppm of impurities and said impurities do not include strontium-containing compounds or said strontium.

9. The method as defined in claim 8, wherein said impurities are selected from the group consisting of potassium, lithium, magnesium and barium.

10. A method of making an optical element from a fracture-resistant large-size calcium fluoride single crystal, said method comprising the steps of:
   a) doping a calcium fluoride raw material with from 1 to 250 ppm of strontium;
   b) melting said calcium fluoride raw material to form a calcium fluoride melt;
   c) cooling the calcium fluoride melt formed in step b) to form the calcium fluoride single crystal by solidification of the melt; and
   d) further processing the calcium fluoride single crystal by at least one of cleaving, cutting, grinding, lapping and polishing to obtain the optical element.

11. The method as defined in claim 10, wherein said calcium fluoride raw material is doped with from 80 to 140 ppm of said strontium.

12. The method as defined in claim 10, wherein said calcium fluoride raw material is doped with said strontium by adding strontium fluoride to said calcium fluoride raw material.

13. The method as defined in claim 10, wherein said calcium fluoride raw material contains from 1 to 10 ppm of sodium as an impurity.

14. The method as defined in claim 10, wherein said calcium fluoride raw material contains up to 100 ppm of impurities and said impurities do not include strontium-containing compounds or said strontium.

* * * * *